United States Patent [19]

Sasahara

[11] Patent Number: 5,341,020
[45] Date of Patent: Aug. 23, 1994

[54] INTEGRATED MULTICELLULAR TRANSISTOR CHIP FOR POWER SWITCHING APPLICATIONS

[75] Inventor: Kunio Sasahara, Tokyo, Japan
[73] Assignee: Sanken Electric Co., Ltd., Japan
[21] Appl. No.: 862,058
[22] Filed: Apr. 2, 1992
[30] Foreign Application Priority Data

Apr. 12, 1991 [JP] Japan ................... 3-108909
Apr. 18, 1991 [JP] Japan ................... 3-113958

[51] Int. Cl.$^5$ ............... H01L 29/52; H01L 29/70
[52] U.S. Cl. ......................... 257/578; 257/583; 257/579; 257/127
[58] Field of Search ........... 257/579, 587, 164, 165, 257/583, 584, 593, 127, 166

[56] References Cited

U.S. PATENT DOCUMENTS 4,205,332  5/1980  Conti et al. ..................... 257/578
4,586,072  4/1986  Nakatani et al. ................ 257/583

Primary Examiner—Rolf Hille
Assistant Examiner—David Hardy
Attorney, Agent, or Firm—Woodcock Washburn Kurtz Mackiewicz & Norris

[57] ABSTRACT

An integrated array of minute transistors, or cells, either of the type having emitters in the form of a mesh and bases in the form of islands, or of the type having emitters in the form of islands and bases in the form of a mesh. When a transistor chip of conventional design was connected to an inductive load such as a transformer or motor and turned off, the outer cells of the chip were more susceptible to breakdown than the inner ones. In order to make all the cells equally resistive to turnoff voltages, a first set of base openings in an insulating film on the semiconductor substrate, through which are exposed the bases of the inner cells are made larger in size than a second set of base openings in the insulating film exposing the bases of the outer cells. Additionally, in a transistor chip having meshed emitters, the peripheral annular part of the mesh is made less in width than each strip of the inner part of the mesh. In a transistor chip having emitters in the form of islands, the emitter islands associated with the outer cells are each made less in size than those associated with the inner cells.

4 Claims, 5 Drawing Sheets

INTEGRATED MULTICELLULAR TRANSISTOR CHIP FOR POWER SWITCHING APPLICATIONS

BACKGROUND OF THE INVENTION

My invention relates to a multicellular transistor chip, by which I mean an aggregate of a multiplicity of minute transistors, referred to as cells, which are built monolithically on a single semiconductor substrate, and more specifically to such a transistor chip of both the type having emitters in the form of a mesh and bases in the form of islands, and the type having emitters in the form of islands and bases in the form of a mesh. The multicellular transistor chip according to my invention is best suited for power switching applications.

The multicellular transistor chip is itself not new. It may be classified into two broad categories, one having an emitter in the form of a mesh, with bases formed like islands in the openings of the mesh, and the other having a base in the form of a mesh, with emitters formed like islands in the openings of the mesh. Whichever the type, the multicellular transistor chip is favorable in the uniformity of current and heat distributions as each of the arrayed cells functions as transistor. The result is a fairly broad area of safe operation, which is one of the most important requirements of power transistors in general.

In the manufacture of such multicellular transistor chips, the base electrode and emitter electrode are coupled to the base and emitter regions of the semiconductor substrate through openings formed in an insulating film, usually of silicon oxide, which overlies the substrate. Each cell requires at least one opening for the connection of the base electrode and at least one other for the connection of the emitter electrode. Openings must also be formed in the insulating film for contacting the base electrode with the annular base portion surrounding the meshed or islandlike emitters. Conventionally, such openings for the connection of the base electrode to the base regions of the substrate were all of the same size.

Multicellular transistor chips of such conventional construction had a drawback, particularly in cases where they were connected to inductive loads such as transformers and motors. The cells of the prior art chips were susceptible to breakdown when turned off, as high voltages are then imposed thereon. There have therefore been long awaited the advent of a multicellular transistor chip that is less susceptible to breakdown at the time of turnoff and, in consequence, wider in safe operating area than hitherto.

SUMMARY OF THE INVENTION

I have hereby invented how to construct a multicellular transistor chip that can withstand higher turnoff voltages than heretofore.

Briefly, my invention may be summarized as an integrated multicellular transistor chip having a semiconductor substrate with an insulating film formed on a first major surface thereof, a base electrode and an emitter electrode formed on the insulating film, and a collector electrode formed on a second major surface, opposite to the first major surface, of the substrate.

The semiconductor substrate has formed therein a base region, an emitter region and a collector region. The base region has an inner base subregion exposed at the first major surface of the substrate, and an outer base subregion surrounding the inner base subregion and also exposed at the first major surface of the substrate. The emitter region is formed in part of the base region so as to be exposed at the first major surface of the substrate. The collector region is disposed contiguous to the base region and exposed at the second major surface of the substrate. Either of the inner base subregion and the emitter region is in the form of a plurality of islands, and the other in the form of a mesh; that is, my invention encompasses multicellular transistor chips of both types.

The insulating film on the first major surface of the substrate has formed therein a first set of base openings through which the inner base subregion contacts the base electrode, a second set of base openings through which the outer base subregion contacts the base electrode, and a plurality of emitter openings through which the emitter region contacts the emitter electrode.

Characteristically, the first set of base openings in the insulating film are each made less in size than the second set of base openings in the insulating film.

I have discovered that in a prior art multicellular transistor chip, the outer cells are more susceptible to breakdown than the inner ones because the outer cells are longer in storage times. The outer cells are longer in storage time because they have each a larger base than does each inner cell. The minority carriers that have been injected from emitter to base when the transistor chip turns on persist in the base after the transistor chip subsequently turns off. Since each outer cell has a larger base, the outer cells still have some minority carriers left even after the minority carriers associated with the inner cells have extinguished. The result is the longer storage time, and therefore the greater susceptibility to breakdown, of the outer cells.

In order to make all the cells of the transistor chip equally unsusceptible to breakdown, I have made the first set of base openings, through which the inner base subregion contacts the base electrode, larger in size than the second set of base openings through which the outer base subregion contacts the base electrode. In this manner, when the transistor chip is reverse biased on being turned off, the minority carriers of the outer cells can be extinguished as quickly as those of the inner cells.

Additionally, in the case where the emitter region takes the form of a mesh, comprising a meshed subregion surrounded by a peripheral annular subregion, the annular emitter subregion may be made less in width than each strip of the meshed emitter subregion. The narrower annular emitter subregion is intended to restrict the amount of minority carriers injected into the bases of the outer cells. Similarly, in the case where the emitter region takes the form of islands, each outer island may be made less in size than each inner island. Transistor chips embodying both schemes will be disclosed.

The above and other features and advantages of my invention will become more apparent, and the invention itself will best be understood, from a study of the following description and appended claims, with reference had to the attached drawings showing the preferred embodiments of my invention.

DESCRIPTION OF THE PREFERRED EMBODIMENTS

Figure 1:
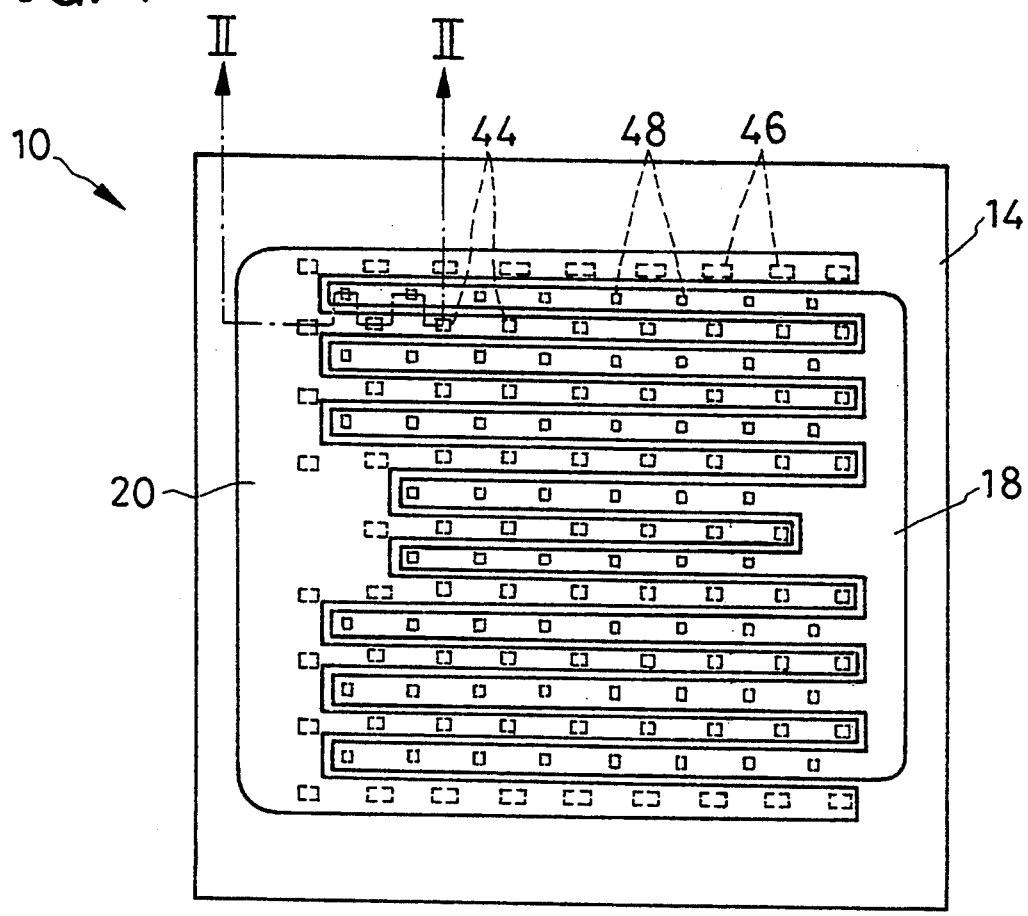
FIG. 1 is a plan view of a first preferred form of multicellular transistor chip constructed in accordance with the novel concepts of my invention, the transistor chip having a meshed emitter region.

I will now describe my invention in detail as embodied in the multicellular transistor chip for power switching applications illustrated in FIGS. 1–4 and therein generally designated 10. With reference first and in particular to FIGS. 1 and 2 the representative power transistor chip comprises a semiconductor substrate 12 of generally flat, square shape, an insulating film 14 formed on a first major surface 16 of the substrate, an emitter electrode 18, a base electrode 20, and a collector electrode 22 on a second major surface 24, opposite to the first major surface, of the substrate. Typically, the semiconductor substrate 12 is made of silicon.

Figure 2:
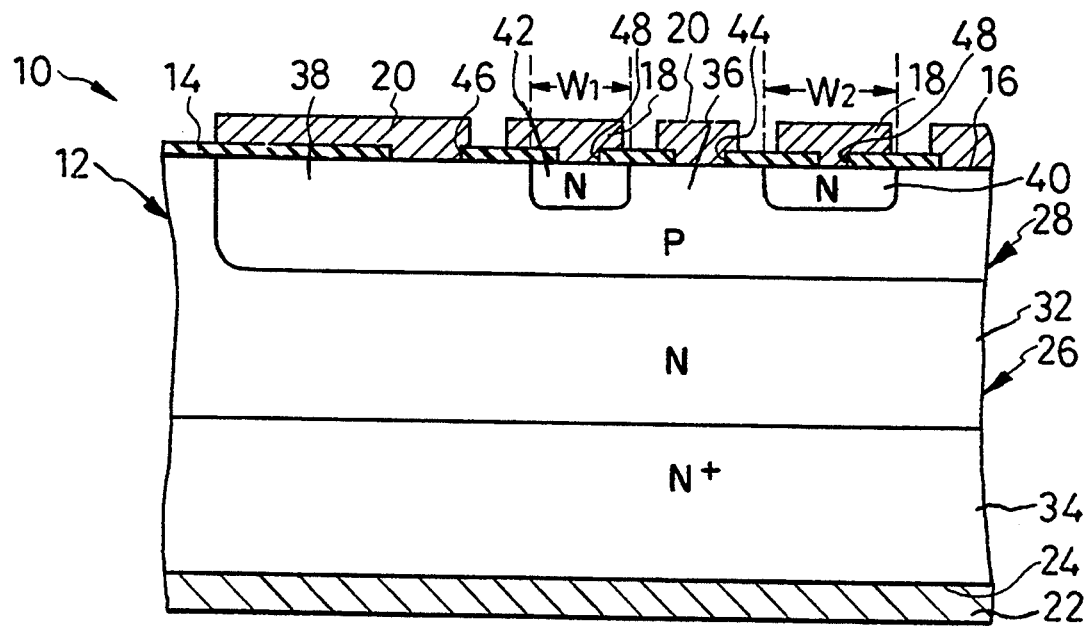
FIG. 2 is an enlarged section through the transistor chip, taken along the line II—II in FIG. 1.
Figure 3:
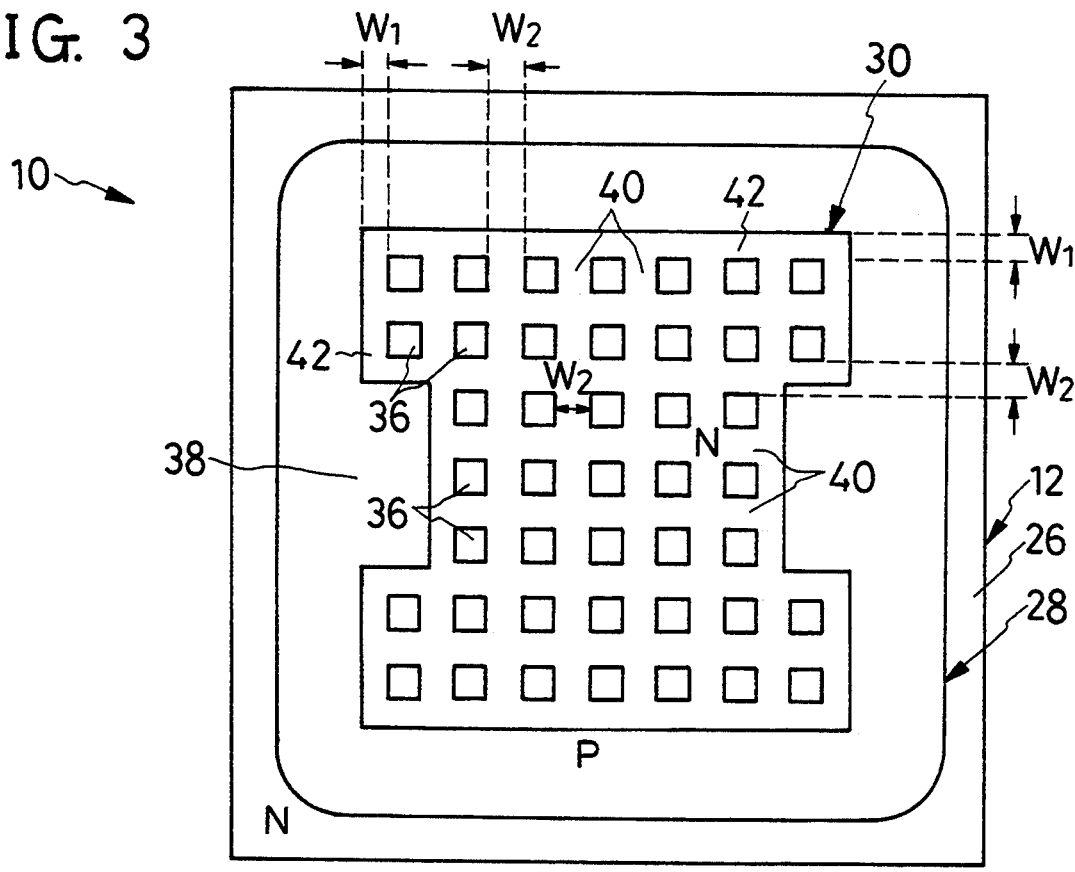
FIG. 3 is a plan view of the semiconductor substrate of the FIG. 1 transistor chip.

As will be best understood from FIGS. 2 and 3, the semiconductor substrate 12 has a collector region 26, a base region 28, and an emitter region 30. The collector region 26 has an N type high resistance subregion 32 and an N+ type low resistance subregion 34. The N type collector subregion 32 is generally dish shaped, having an annular portion exposed at the first major surface 16 of the substrate 12. The N+ type collector subregion 34 is contiguous to the N type collector subregion 32 and provides the second major surface 24 of the substrate 12. The collector electrode 22 makes ohmic contact with the N+ type collector subregion 34.

Formed by diffusing boron into part of the N type collector subregion 32, the base region 28 comprises a multiplicity of subregions 36 which are exposed at the first major surface 16 of the substrate 12 in the form of an array of islands, and an annular peripheral subregion 38 which is also exposed at the first major surface of the substrate and which surrounds the islandlike base subregions 36.

As seen in a plan view as in FIG. 3, the islandlike base subregions 36 are each square shaped, of the same size, and regularly arrayed with constant spacings in both of two orthogonal directions. This array of islandlike base subregions 36 is a direct result of the meshed arrangement the emitter region 30 to be detailed hereafter.

The emitter region 30 is of the N type, being formed by selective diffusion of phosphor into the base region 28. The emitter region 30 comprises a meshed subregion 40 and an annular peripheral subregion 42. The meshed emitter subregion 40 defines a multiplicity of arrayed openings filled by the islandlike base subregions 36. The annular emitter subregion 42 lies between the array of islandlike base subregions 36 and the annular peripheral base subregion 38.

As indicated in both FIGS. 2 and 3, the width $W_1$ of the annular emitter subregion 42 is less than the width $W_2$ of each of the stripes of the meshed emitter subregion 40 in accordance with a feature of my invention. Typically, $W_1$ is 80 micrometers, and $W_2$ 100 micrometers. Speaking more broadly, however, I suggest that the ratio $W_1/W_2$ be from 0.6 to 0.9. I will later explain why this difference is necessary between $W_1$ and $W_2$.

FIG. 3 also indicates that, as seen in a plan view as in this figure, the emitter region 30 has a pair of opposite concave sides, with the annular base subregion 38 correspondingly convexed toward the emitter region. These convexed parts of the annular base subregion 38 are in register with those parts of the emitter electrode 18 and base electrode 20 where the leads, not shown, are to be bonded.

Figure 4:
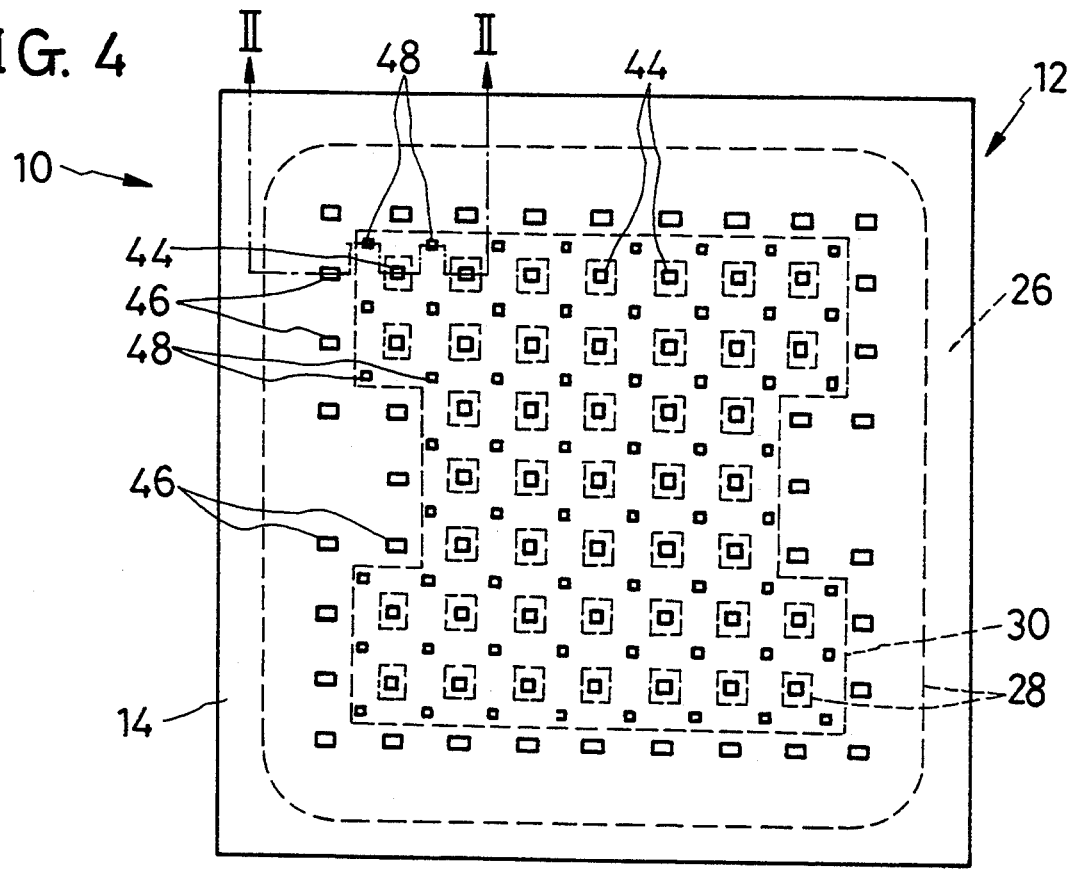
FIG. 4 is a view similar to FIG. 1 except that the emitter electrode and base electrode are not shown, revealing the insulating film together with various openings formed therein, the line II—II in this figure also showing the planes along which the transistor chip is shown sectioned in FIG. 2.

As shown in FIGS. 1, 2 and 4, the insulating film 14 on the first major surface of the semiconductor substrate 12 has a multiplicity of openings formed therein for contacting the base region 28 and emitter region 30 with the base electrode 20 and emitter electrode 18. FIGS. 1 and 2, respectively. The following discussion of these openings in the insulating film 14 will be best understood by referring principally to FIG. 4 taken together with FIGS. 1 and 2.

The insulating film 14 has, first of all, a first set of multiple base openings 44 for exposing the islandlike subregions 36 of the base region 28. The first set of base openings 44 are all of the same shape and size, each square in shape, and are arranged in register with central parts of the base subregions 36. A second set of multiple base openings 46 are formed in register with the annular subregion 38 of the base region 28. The second set of base openings 46 are also all of the same shape and size, each rectangular in shape, and larger than the first set of base openings 44. Generally, the second set of base openings 46 should be each from 1.5 to 4.0 times, preferably approximately twice, as large as the first set of base openings 44.

Also formed in the insulating film 14 a multiplicity of emitter opening 48 exposing parts of the meshed subregion 40 and annular peripheral subregion 42 of the emitter region 30. The emitter openings 48 are all of the same shape and size, each square in shape, and less in size than each of the first set of base openings 44. Each emitter opening 48 is disposed at the center of every four surrounding ones of the first set of base openings 44, or at the center of every four surrounding ones of the first and second sets of base openings 44 and 46.

With reference back to FIGS. 1 and 2 the emitter electrode 18 and base electrode 20 are formed in the shape of combs on the insulating film 14. The emitter electrode 18 contacts the meshed subregion 40 and peripheral subregion 42 of the emitter region 30 via the emitter openings 48. The base electrode 20 contacts the islandlike subregions 36 and annular subregion 38 of the base region 28 via the first and second sets of base openings 44 and 46. As has been stated, the unshown emitter and base leads are to be bonded to those parts of the emitter electrode 18 and base electrode 20 which overlie the inwardly convexed parts of the annular base subregion 38.

OPERATION

Figure 5:
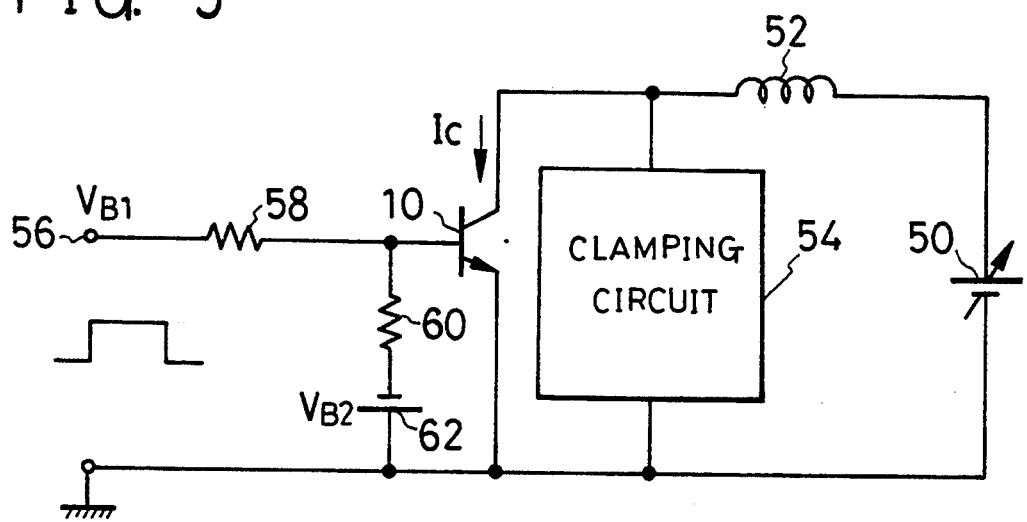
FIG. 5 is a schematic electrical diagram of means used for testing the antibreakdown capability of the FIG. 1 transistor chip.

I measured the area of safe operation of twenty multicellular transistor chips, each constructed as set forth hereinabove with reference to FIGS. 1–4, by the circuitry of FIG. 5. At 10 in this figure is shown one such transistor chip being tested, with a variable, direct current power supply 50 connected between its collector and emitter via an inductance coil 52. Therefore, when the transistor chip 10 is turned off, the sum of the voltage of the power supply 50 and the voltage due to the coil 52 is impressed between its collector and emitter. I connected a clamping circuit 54 across the transistor chip 20 in order to maintain the voltage thus imposed thereon at a constant value of 950 volts.

The base of the transistor chip 10 was connected to a base drive terminal 56 via a resistor 58. Another resistor 60 and reverse biasing power supply 62 were connected between the base and emitter of the transistor chip 10.

Figure 6:
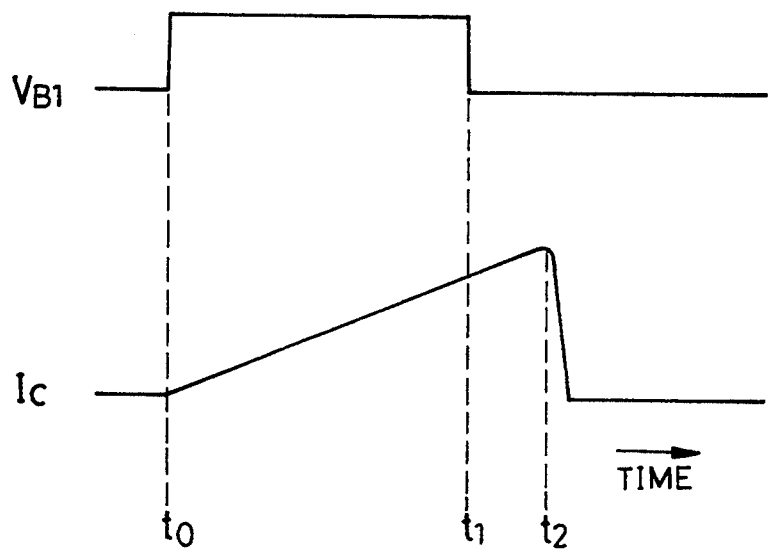
FIG. 6 is a waveform diagram useful in explaining how the transistor chip was tested by the FIG. 5 means.

In order to ascertain the magnitude of the collector current $I_C$ at the breakdown of the transistor chip 10, I applied a base drive voltage $V_{B1}$ of FIG. 6 from the base drive terminal 56 while, at first, a relatively low voltage was being impressed by the power supply 50. This drive voltage $V_{B1}$ was higher than the reverse bias voltage $V_{B2}$. Accordingly, during the duration $t_0$–$t_1$ of each pulse of the drive voltage $V_{B1}$, a forward bias voltage equivalent to $V_{B1}$ minus $V_{B2}$ was impressed to the transistor chip 10 thereby causing conduction therethrough.

The collector current $I_C$ of the transistor chip 10 would increase linearly, as depicted in FIG. 6, as the load thereon was the coil 52. Because of storage time inherent in transistors, however, the transistor chip would not turn off immediately when the application of the drive voltage $V_{B1}$ was discontinued at the time $t_1$ in FIG. 6. The application of the reverse bias voltage $V_{B2}$ from the power supply 62 after the time $t_1$ was intended to reduce the length of storage time. However, since the storage time cannot possibly be reduced to zero, the transistor chip 10 would turn off only at a subsequent time $t_2$ when the reduced storage time terminated.

I ascertained the peak magnitude of the collector current $I_C$ by an oscilloscope. This peak value was to be relied upon for the determination of the safe operating area.

Then, after increasing the voltage of the power supply 50, I reapplied a base drive pulse from the terminal 56 and again measured the collector current $I_C$ in a like manner. The increase in the supply voltage resulted in a steeper ramp of the collector current $I_C$ and, in consequence, in the ultimate breakdown of the transistor chip 10. All of the twenty transistor chips tested broke down at collector current values ranging from 4.8 to 5.5 amperes. In other words, none of the tested transistor chips according to my invention broken done at collector current values less than 4.8 amperes.

By way of comparison I prepared twenty prior art test transistor chips which were of the same construction as the transistor chip 10 FIGS. 1–4 except that the width $W_1$, FIGS. 2 and 3, of the annular emitter subregion 42 was equal to the width $W_2$ of each of the stripes of the meshed emitter subregion 40 and that the first set of base openings 44, FIGS. 2 and 4, in the insulating film 14 were each equal in area to the second set of base openings 46.

I measured the values of the collector current $I_C$ at which the prior art test transistor chips broke down, by the same method as above. Nineteen out of the twenty prior art test transistor chips broken down at collector current values as low as from 1.6 to 2.5 amperes, and the other one at 5.5 amperes.

Obviously, therefore, the improved antibreakdown capability of the multicellular transistor chip according to my invention is attributable to the smaller width $W_1$ of the annular peripheral emitter subregion 42 than the width $W_2$ of each strip of the meshed emitter subregion 40, and to the larger area of each of the second set of base openings 46 than that of each of the first set of base openings 44. I have discovered that these structural features make the storage time of the transistor chip according to my invention shorter than that of the prior art. I will discuss why the storage time of the prior art is longer, before explaining the reasons for the shorter storage time made possible by the noted structural features.

A closer study of the prior art transistor chips, tested as above, revealed that breakdown had occurred at or adjacent the annular peripheral subregion 42. I infer from this fact that the outer cells, as seen in a plan view as in FIG. 3, of each prior art chip are longer in storage time than the inner ones. For, if all the cells had the same length of storage time, the collector current flowing into each cell would be of the same peak magnitude. All the cells would then be equally susceptible, or equally unsusceptible, to breakdown regardless of their relative locations on the substrate. This inconsistency with the results of the tests above can be explained only by the inference that the outer cells are longer in storage time than the inner ones. The outer cells must have remained conductive even after the inner cells had turned off, giving rise to greater power loss, with consequent heater heat generation, and ultimately resulting in breakdown.

Why is it, then, that the outer cells of the prior art chips are longer in storage time than the inner ones? I will answer this question by referring to FIGS. 1–4 because the prior art chips tested were analogous in construction with the chip 10 of my invention except that, in the prior art, the width $W_1$ of the annular emitter subregion 42 was equal to the width $W_2$ of each strip of the meshed emitter subregion 40 and that the first set of base openings 44 were each equal in area to the second set of base openings 46.

Generally, it is desirable from the standpoint of reliability that the base and emitter leads of multicellular transistor chips be bonded to the base and emitter electrodes in positions of registry with the annular base subregion 38. The annular base subregion 38 must therefore be sufficiently wide to assure the reliability of lead bonding. As an inevitable result of this requirement, the outer cells have each a larger base zone than does each inner one.

The minority carriers that have been injected from the emitter to the base region when the transistor chip turns on persist in the base region 28 even after the transistor chip becomes reverse biased at the time $t_1$ in FIG. 6. Each outer cell, having a larger base zone as aforesaid, has a greater number of residual minority carriers than does each inner cell. Consequently, even after the minority carriers associated with the inner cells become zero, the outer cells still have some minority carriers left. The result is the longer storage time of the outer cells.

Contrastingly, in the transistor chip 10 according to my invention, the smaller width $W_1$ of the annular emitter subregion 42 serves to restrict the number of minority carriers injected into the annular base subregion 38. It will also be recalled that the second set of base openings 46, which expose parts of the annular base subregion 38, are made larger than the first set of base openings 44 exposing the islandlike base subregion 36 in the transistor chip 10 according to my invention. This feature makes it possible for the base-to-emitter reverse biasing of the transistor chip 10 to effectively cause the recombination of the minority carriers.

It is thus seen that all the cells of the transistor chip 10 according to my invention are far more alike in storage time than those of the prior art. Therefore, since the outer cells are no less susceptible to breakdown than the inner cells, the transistor chip 10 as a whole can withstand higher turnoff voltages, and thus has a wider safe operating area, than heretofore.

SECOND FORM

Figure 7:
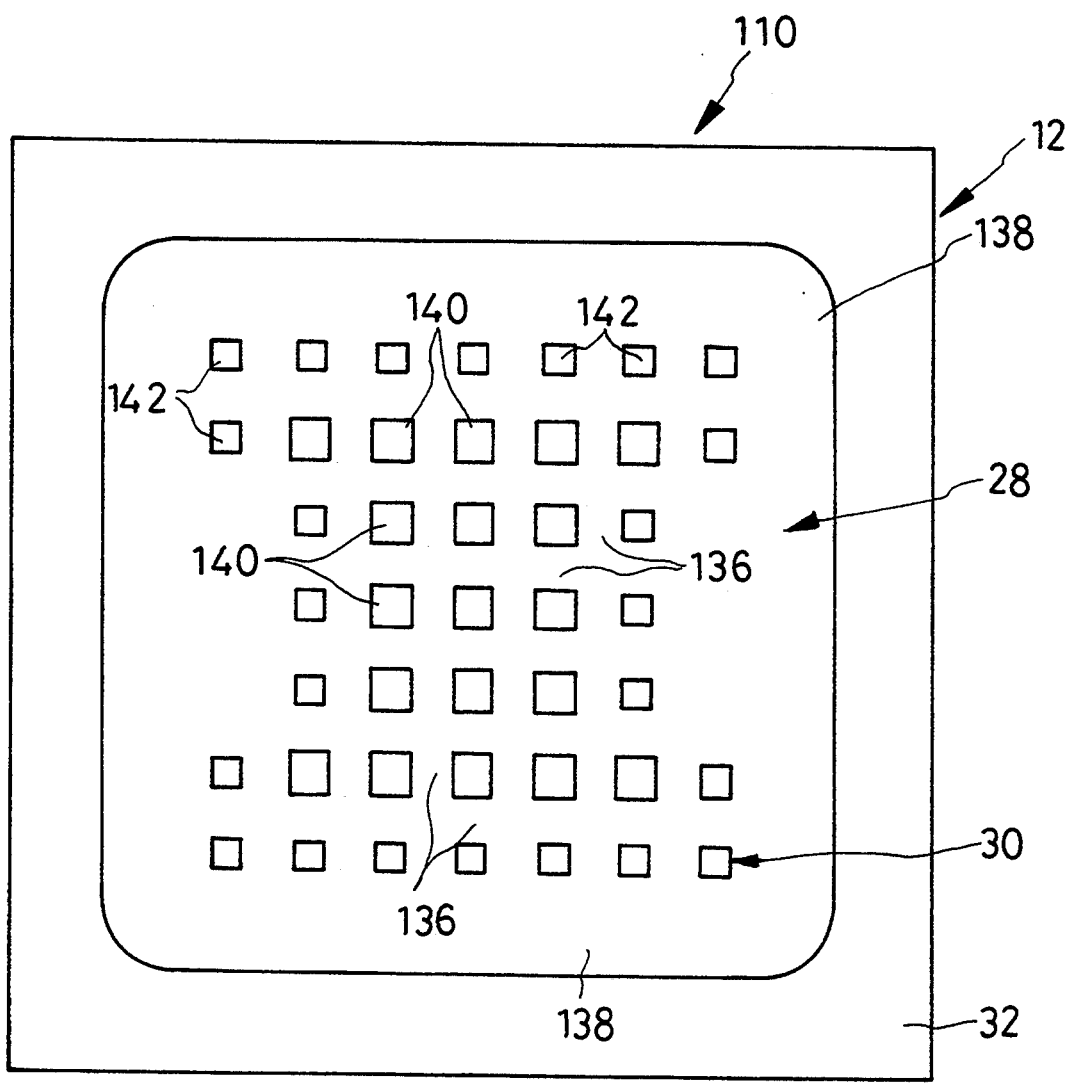
FIG. 7 is a plan view of the semiconductor substrate of an alternate form of multicellular transistor chip according to my invention, the alternate transistor chip having islandlike emitter regions.
Figure 8:
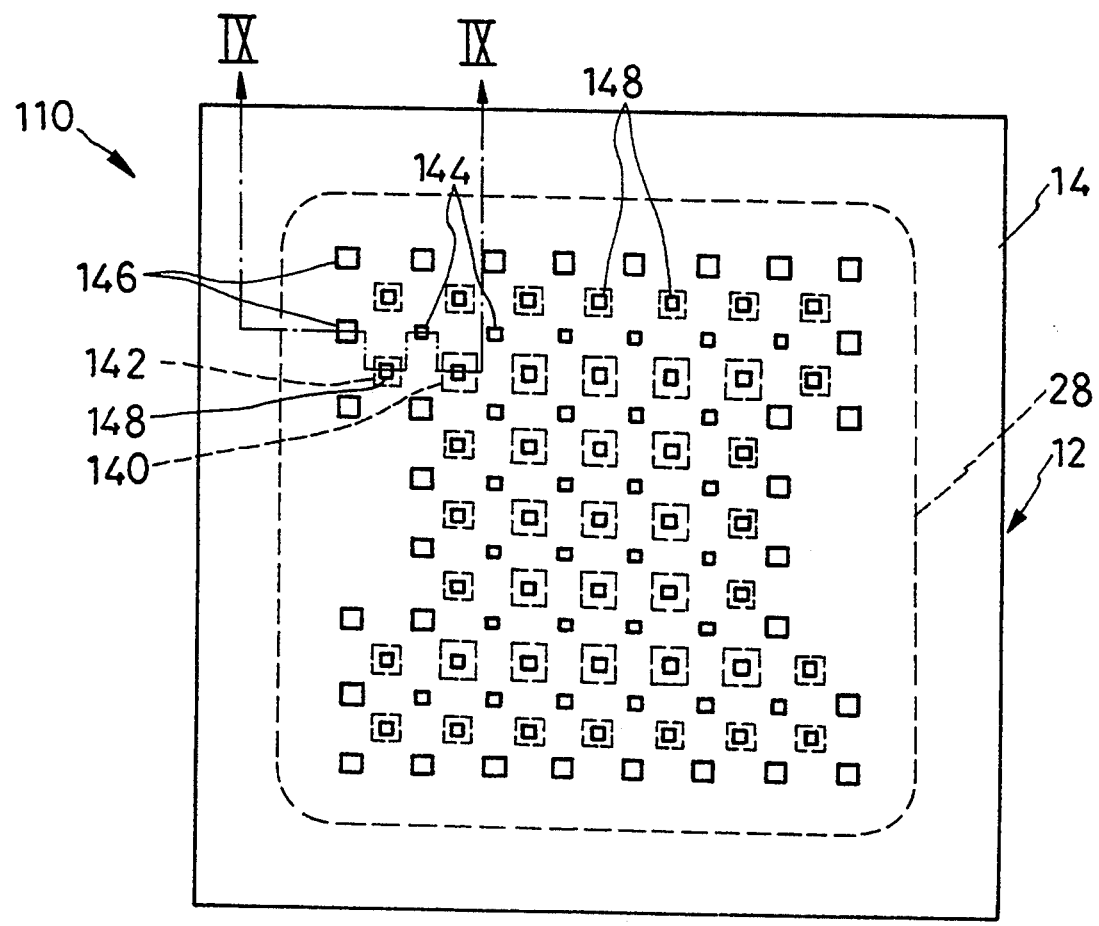
FIG. 8 is a plan view of the FIG. 7 transistor chip, the view not showing the emitter electrode and base electrode in order to clearly reveal the various openings formed in the insulating film on the semiconductor substrate.
Figure 9:
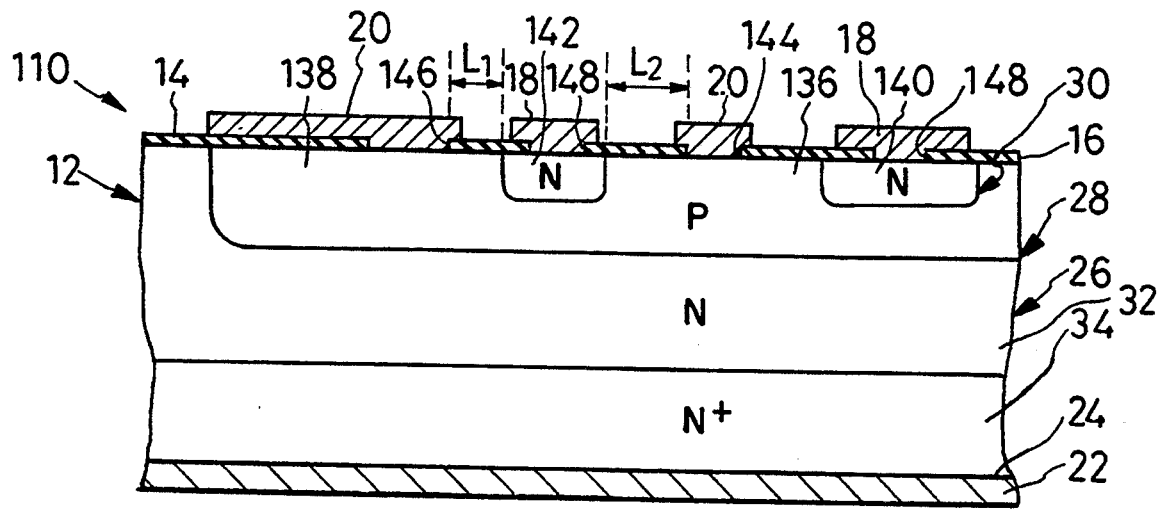
FIG. 9 is an enlarged section through the FIG. 7 transistor chip, taken along the line IX—IX in FIG. 8.

FIGS. 7-9 illustrate alternative form of multicellular transistor chip 110 according to my invention. A comparison of FIG. 9 with FIG. 2 will indicate that the alternative transistor chip 110 also comprises the silicon substrate 12 with the insulating film 14 on its first major surface 16, the emitter electrode 18, the base electrode 20, and the collector electrode 22 on the second major surface 24 of the substrate. The substrate 12 has the collector region 26, the base region 28, and the emitter region 30. The collector region 26 has the N type high resistance subregion 32 and the N+ type low resistance subregion 34. The N type collector subregion 32 has the annular portion exposed at the first major surface 16 of the substrate 12.

As will be noted from FIG. 7, the alternative transistor chip 110 differs from the first disclosed chip 110 in that the emitter region 30 takes the form of a multiplicity of subregions 140 and 142 which are exposed at the first major surface 16 of the substrate 12 in the form of an array of islands, instead of in the form of a mesh as in the transistor chip 10. It will be also noted from FIG. 7 that the emitter subregions include inwardly located subregions 140, as seen in a plan view as in this figure, and outer or peripheral subregions 142.

Although the two groups of islandlike emitter subregions 140 and 142 are both each square in shape, the inner emitter subregions 140 are each greater in size than the outer emitter subregions 142. Generally, the size of each outer emitter subregion, 142 should be from 60 to 90 percent, preferably 80 percent, of that of each inner emitter subregion 140.

As a result of the islandlike formation of the emitter region 30 in the base region 28, this base region takes the form of a mesh, having a meshed subregion 136 and an annular peripheral subregion 138. The meshed base subregion 136 defines a multiplicity of arrayed openings filled by the islandlike emitter subregions 140 and 142.

FIG. 8 shows various openings formed in the insulating film 14 to expose the base and emitter regions of the substrate 12. Such openings include a first set of base openings 144 exposing the meshed base subregion 136, a second set of base openings 146 exposing the annular base subregion 138, and emitter openings 148 exposing the islandlike emitter subregions 140 and 142.

The first set of base openings 144 are each less (e.g. 50 percent) in size than the second set of base openings 146. Also, as indicated in FIG. 9, the distance $L_1$ between each of the second set of base openings 146 and one adjacent outer islandlike emitter subregion 142 is less than the distance $L_2$ between each outer islandlike emitter subregion 142 and the neighboring one of the first set of base openings 144.

FIG. 9 further shows that the emitter electrode 18 contacts the islandlike emitter subregions 140 and 142 through the emitter openings 148. The base electrode 20 contacts the meshed base subregion 136 through the first set of base openings 144, and the annular peripheral base subregion 138 through the second set of base openings 146. The emitter electrode 18 and base electrode 20 are shaped approximately as shown in FIG. 1.

OPERATION OF SECOND FORM

In this alternate transistor chip 110, too, the minority carriers in the base zones of the outer cells can be quickly extinguished by reverse biasing the base and emitter electrodes when the transistor chip turns off. Such quick extinction of the minority carriers results from the fact that the first set of base openings 144 are each less in size than the second set of base openings 146 and that the distance $L_1$ is less than the distance $L_2$.

Additionally, in this alternate transistor chip 110, the outer islandlike emitter subregions 142 are each made less in size than the inner islandlike emitter subregions 140. This feature serves to reduce the number of minority carriers injected from the emitter to base zones of the outer cells. All the cells of the transistor chip 110 can thus be made approximately equal in the length of storage time, resulting in improved resistance to breakdown and, therefore, in a wider area of safe operation than heretofore.

Although I have shown and described the multicellular transistor chip of my invention in terms of but two typical forms thereof, I do not wish my invention to be limited by the exact details of this disclosure. For instance, in the transistor chip 10 of FIGS. 1-4, the nine top row of base openings 46 and the nine bottom row of base openings 46 could each be replaced by a single slot. In the transistor chip 100 of FIGS. 7-9, too, the top and bottom rows of base openings 146 could each be replaced by a single slot. A variety of other modifications, alterations and adaptations of my invention may be resorted to in a manner limited only by a just interpretation of the following claims.

What I claims is:

1. An integrated multicellular transistor chip comprising:
   (A) a semiconductor substrate having a first and a second opposite major surfaces, the substrate comprising:
   (a) a base region comprising an inner base subregion exposed at the first major surface of the substrate, and an outer base subregion surrounding the inner base subregion and exposed at the first major surface of the substrate, the inner base subregion comprising a plurality of islands;
   (b) an emitter region formed in the base region and exposed at the first major surface of the substrate, the emitter region comprising an inner emitter subregion and a peripheral annular emitter subregion surrounding the inner emitter subregion; and
   (c) a collector region disposed contiguous to the base region and exposed at the second major surface of the substrate;

(B) an insulating film formed on the first major surface of the substrate, the insulating film having formed therein:
  (a) a first set of base openings exposing the plurality of islands of the inner base subregion;
  (b) a second set of base openings exposing the outer base subregion, the second set of base openings being separated from the first set of base openings; and
  (c) a plurality of emitter openings exposing the emitter region;
(C) a base electrode formed on the insulating film and electrically contacting the inner and the outer base subregions through the first and the second sets of base openings in the insulating film;
(D) an emitter electrode formed on the insulating film and electrically contacting the inner emitter subregion and the peripheral annular emitter subregion through the emitter openings in the insulating film; and
(E) a collector electrode formed in electrical contact with the collector region;
(F) the first set of base openings in the insulating film being each less in area than the second set of base openings in the insulating film; wherein each of the second set of base openings is from 1.5 to 4.0 times as large as each of the first set of base openings.

2. An integrated multicellular transistor chip comprising:
(A) a semiconductor substrate having a first and a second opposite major surfaces, the substrate comprising:
  (a) a base region comprising an inner base subregion exposed at the first major surface of the substrate, and an outer base subregion surrounding the inner base subregion and exposed at the first major surface of the substrate, the inner base subregion comprising a plurality of islands;
  (b) an emitter region formed in the base region and exposed at the first major surface of the substrate, the emitter region comprising an inner emitter subregion and a peripheral annular emitter subregion surrounding the inner emitter subregion; and
  (c) a collector region disposed contiguous to the base region and exposed at the second major surface of the substrate;
(B) an insulating film formed on the first major surface of the substrate, the insulating film having formed therein:
  (a) a first set of base openings exposing the plurality of islands of the inner base subregion;
  (b) a second set of base openings exposing the outer base subregion, the second set of base openings being separated from the first set of base openings; and
  (c) a plurality of emitter openings exposing the emitter region;
(C) a base electrode formed on the insulating film and electrically contacting the inner and the outer base subregions through the first and the second sets of base openings in the insulating film;
(D) an emitter electrode formed on the insulating film and electrically contacting the inner emitter subregion and the peripheral annular emitter subregion through the emitter openings in the insulating film; and
(E) a collector electrode formed in electrical contact with the collector region;
(F) the first set of base openings in the insulating film being each less in area than the second set of base openings in the insulating film; wherein the width is from 60 to 90 percent of the width and wherein a first width between the inner base subregion and the outer base subregion in the peripheral annular emitter subregion is less than a second width between the islands in the inner emitter subregion.

3. An integrated multicellular transistor chip comprising:
(A) a semiconductor substrate having a first and a second opposite major surfaces, the substrate comprising:
  (a) a base region comprising an inner base subregion exposed at the first major surface of the substrate, and an outer base subregion surrounding the inner base subregion and exposed at the first major surface of the substrate, the inner base subregion comprising a plurality of islands;
  (b) an emitter region formed in the base region and exposed at the first major surface of the substrate, the emitter region comprising an inner emitter subregion and a peripheral annular emitter subregion surrounding the inner emitter subregion; and
  (c) a collector region disposed contiguous to the base region and exposed at the second major surface of the substrate;
(B) an insulating film formed on the first major surface of the substrate, the insulating film having formed therein:
  (a) a first set of base openings exposing the plurality of islands of the inner base subregion;
  (b) a second set of base openings exposing the outer base subregion, the second set of base openings being separated from the first set of base openings; and
  (c) a plurality of emitter openings exposing the emitter region;
(C) a base electrode formed in the insulating film and electrically contacting the inner and the outer base subregion through the first and the second sets of base openings in the insulating film;
(D) an emitter electrode formed on the insulating film and electrically contacting the inner emitter subregion and the peripheral annular emitter subregion through the emitter openings in the insulating film; and
(E) a collector electrode formed in electrical contact with the collector region;
(F) the first set of base openings in the insulating film being each less in area than the second set of base openings in the insulating film; wherein each of the second set of base openings is from 1.5 to 4.0 times as large as each of the first set of the base openings.

4. An integrated multicellular transistor chip comprising:
(A) a semiconductor substrate having a first and a second opposite major surfaces, the substrate comprising:
  (a) a base region comprising an inner base subregion exposed at the first major surface of the substrate, and an outer base subregion surrounding the inner base subregion and exposed at the first major surface of the substrate, the inner base subregion comprising a plurality of islands;

(b) an emitter region formed in the base region and exposed at the first major surface of the substrate, the emitter region comprising an inner emitter subregion and a peripheral annular emitter subregion surrounding the inner emitter subregion; and (c) a collector region disposed contiguous to the base region and exposed at the second major surface of the substrate;

(B) an insulating film formed on the first surface of the substrate, the insulating film having formed therein:

(a) a first set of base openings exposing the plurality of islands of the inner base subregion;

(b) a second set of base openings exposing the outer base subregion, the second set of base openings being separated from the first set of base openings; and (c) a plurality of emitter openings exposing the emitter region;

(C) a base electrode formed on the insulating film and electrically contacting the inner and the outer base subregions through the first and the second sets of the base openings in the insulating film;

(D) an emitter electrode formed in the insulating film and electrically contacting the inner emitter subregion and the peripheral annular emitter subregion through the emitter openings in the insulating film; and (E) a collector electrode formed in electrical contact with the collector region;

(F) the first set of base openings in the insulating film being each less in area than the second set of base openings in the insulating film; wherein the first surface area of each other island is from 60 to 90 percent of the second surface area of each inner island and wherein a first surface area of each outer island is less than a second surface area of each inner island.

* * * * *